(12) United States Patent
Chuang et al.

(10) Patent No.: US 11,201,085 B2
(45) Date of Patent: Dec. 14, 2021

(54) SEMICONDUCTOR DEVICE STRUCTURE HAVING AIR GAP AND METHOD FOR FORMING THE SAME

(71) Applicant: Taiwan Semiconductor Manufacturing Co., Ltd., Hsinchu (TW)

(72) Inventors: Chia-Lin Chuang, Taoyuan (TW); Chia-Hao Chang, Hsinchu (TW); Cheng-Chi Chuang, New Taipei (TW); Yu-Ming Lin, Hsinchu (TW); Chih-Hao Wang, Baoshan Township, Hsinchu County (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/800,246

(22) Filed: Feb. 25, 2020

(65) Prior Publication Data

US 2021/0265218 A1    Aug. 26, 2021

(51) Int. Cl.
| | | |
|---|---|---|
| *H01L 21/8234* | (2006.01) | |
| *H01L 27/088* | (2006.01) | |
| *H01L 27/092* | (2006.01) | |
| *H01L 21/768* | (2006.01) | |

(52) U.S. Cl.
CPC ........ *H01L 21/823431* (2013.01); *H01L 21/76816* (2013.01); *H01L 21/823437* (2013.01); *H01L 27/0886* (2013.01); *H01L 27/0924* (2013.01)

(58) Field of Classification Search
CPC ......... H01L 21/823431; H01L 21/7816; H01L 21/823437; H01L 27/0886; H01L 27/0924
See application file for complete search history.

(56) References Cited

U.S. PATENT DOCUMENTS

| | | |
|---|---|---|
| 8,772,109 B2 | 7/2014 | Colinge |
| 8,785,285 B2 | 7/2014 | Tsai et al. |
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |
| 9,236,267 B2 | 1/2016 | De et al. |
| 9,236,300 B2 | 1/2016 | Liaw |
| 9,520,482 B1 | 12/2016 | Chang et al. |
| 9,576,814 B2 | 2/2017 | Wu et al. |
| 9,721,897 B1 * | 8/2017 | Cheng .................. H01L 23/535 |
| 10,580,692 B1 * | 3/2020 | Park .................... H01L 21/7682 |

(Continued)

*Primary Examiner* — Christine A Enad
(74) *Attorney, Agent, or Firm* — Birch, Stewart, Kolasch & Birch, LLP

(57) ABSTRACT

A semiconductor device structure is provided. The semiconductor device structure includes a first gate structure and a second gate structure formed over a semiconductor substrate. The semiconductor device structure also includes a first insulating cap structure formed between and adjacent to the first gate structure and the second gate structure. The first insulating cap structure is separated from the semiconductor substrate by a first air gap. The first air gap includes a first portion extending into the first insulating cap structure and a second portion extended from the bottom of the first portion toward the semiconductor substrate. The first portion has a width that is less than the width of the second portion.

20 Claims, 14 Drawing Sheets

(56) References Cited

U.S. PATENT DOCUMENTS

2015/0372102 A1* 12/2015 Usami ................ H01L 23/5222
  257/327
2020/0035804 A1* 1/2020 Chen ................ H01L 29/66545
2020/0312977 A1* 10/2020 Loubet ............. H01L 29/66545

* cited by examiner

SEMICONDUCTOR DEVICE STRUCTURE HAVING AIR GAP AND METHOD FOR FORMING THE SAME

BACKGROUND

The semiconductor integrated circuit (IC) industry has experienced rapid growth. Advances in semiconductor manufacturing processes have resulted in semiconductor devices with finer features and/or higher degrees of integration. This scaling-down process generally provides benefits by increasing production efficiency and lowering associated costs.

As the semiconductor industry has progressed into nanometer technology process nodes in pursuit of higher device density, challenges from both fabrication and design issues have resulted in the development of three-dimensional designs, such as the fin field effect transistor (FinFET) that is fabricated with a thin vertical "fin" (or fin structure) extending from a substrate.

Although existing FinFET manufacturing processes have generally been adequate for their intended purposes, they have not been entirely satisfactory in all respects, especially as device scaling-down continues. For example, it is a challenge to a semiconductor device structure with reduced parasitic capacitance at smaller and smaller sizes.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

DETAILED DESCRIPTION

Figure 1A:
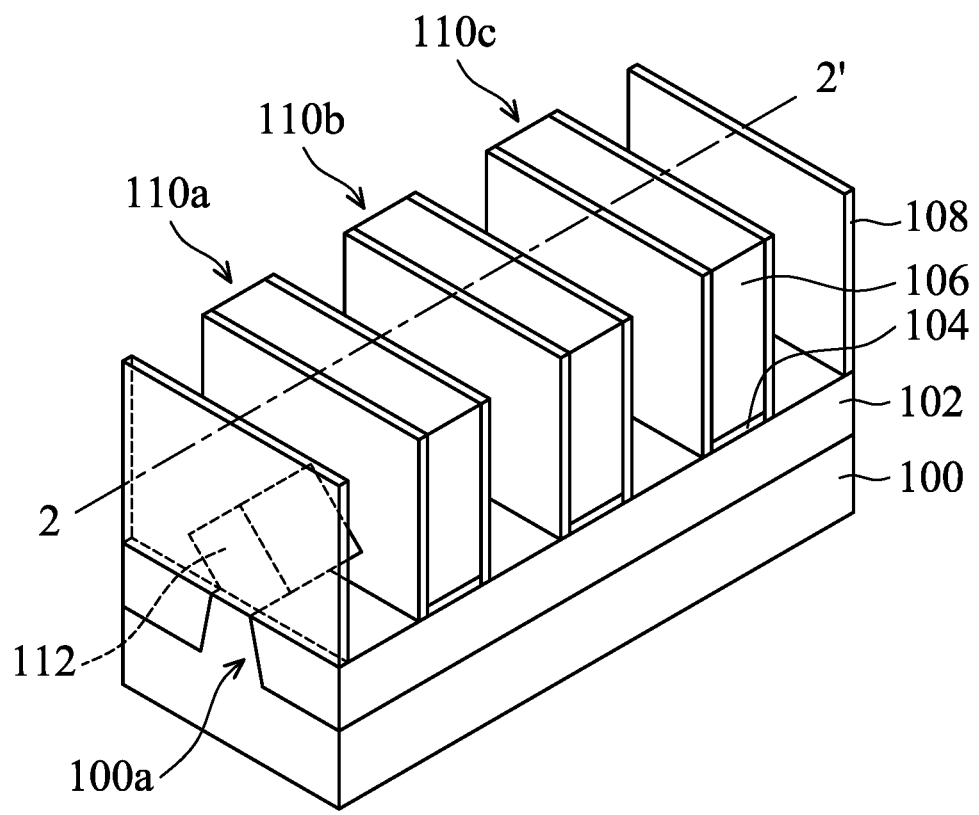
FIGS. 1A to 1D illustrate perspective views of various stages of manufacturing a semiconductor device structure in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

Embodiments for manufacturing semiconductor device structures are provided. The semiconductor device structures may include gate structures and source/drain contact structures across or over a fin structure of semiconductor substrate. An insulating cap structure is formed between two adjacent gate structures. The insulating cap structure and the fin structure of the semiconductor substrate are separated by an inverted T-shaped air gap. The formation of the insulating cap structure and the inverted T-shaped air gap includes forming a recessed sacrificial material in a space between the two adjacent gate structures and forming two insulating spacers over the recessed sacrificial material in the space between the first gate structure and the second gate structure. Afterwards, the recessed sacrificial material is removed and an insulating bridge is then formed between the insulating spacers to form the insulating cap structure and the inverted T-shaped air gap between the first insulating cap structure and the fin structure the fin structure of the semiconductor substrate. The inverted T-shaped air gap has a lower dielectric constant (k) than that of the other dielectric materials, so that the parasitic capacitance between the two adjacent gate structures and between the conductive via structure and the adjacent gate stack in the gate structure can be reduced. In addition, the insulating cap structure can be made of a low-k material, so that the parasitic capacitance can be lowered further. As a result, the device performance can be effectively increased.

Figure 1B:
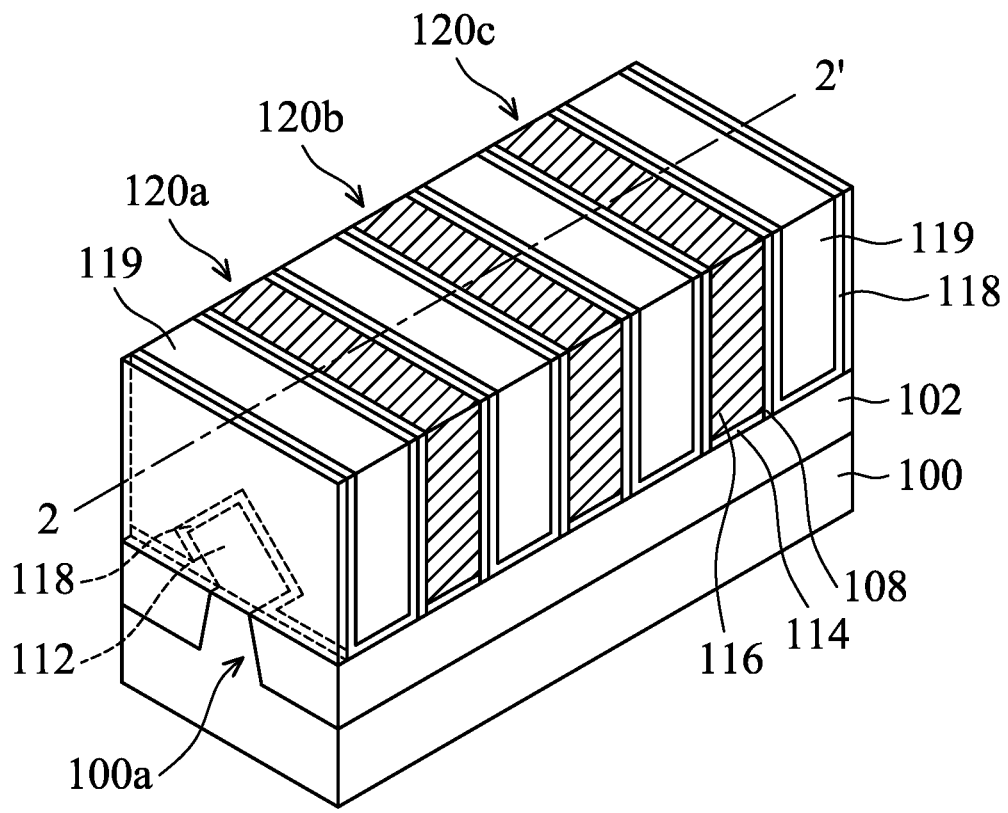
Figure 1C:
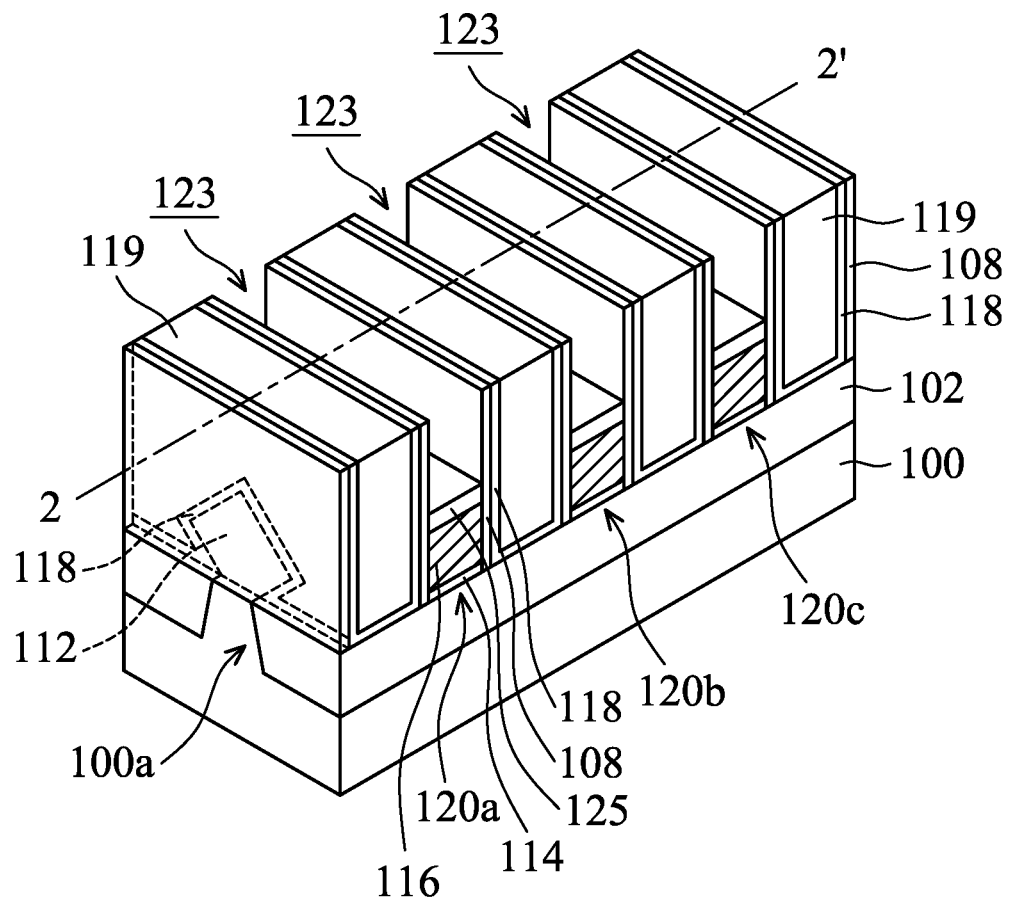
Figure 1D:
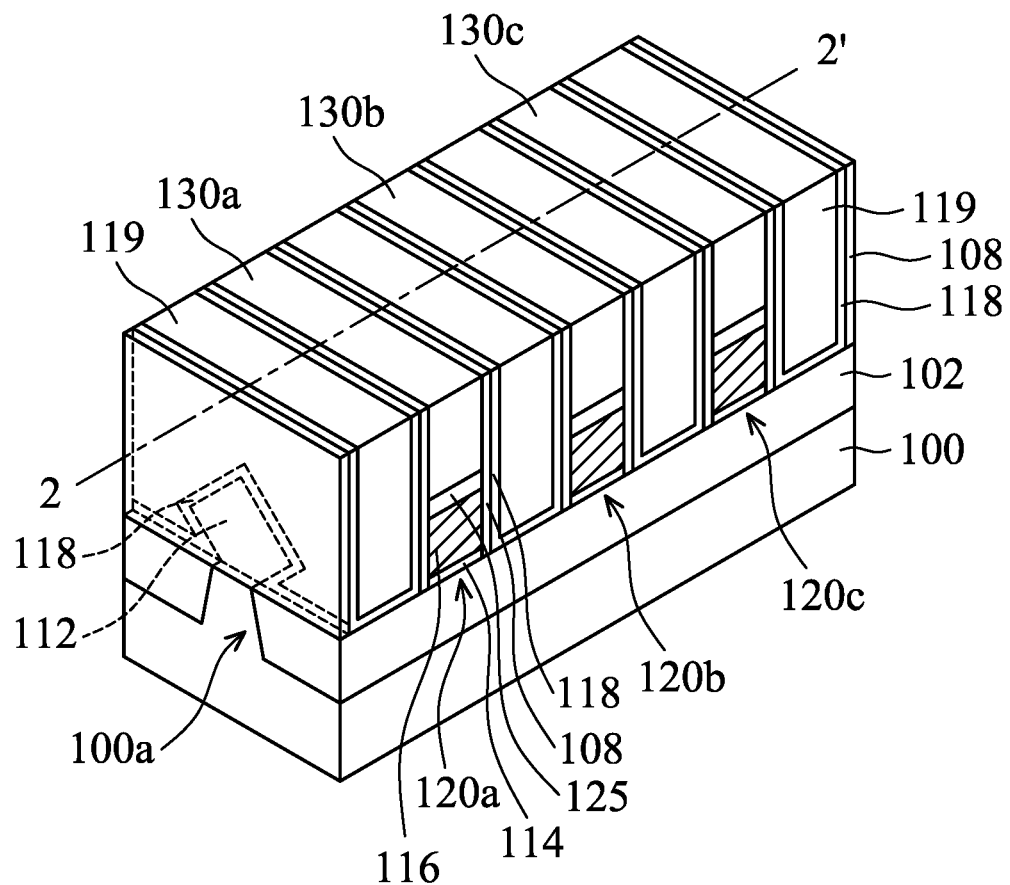
Figure 2A:
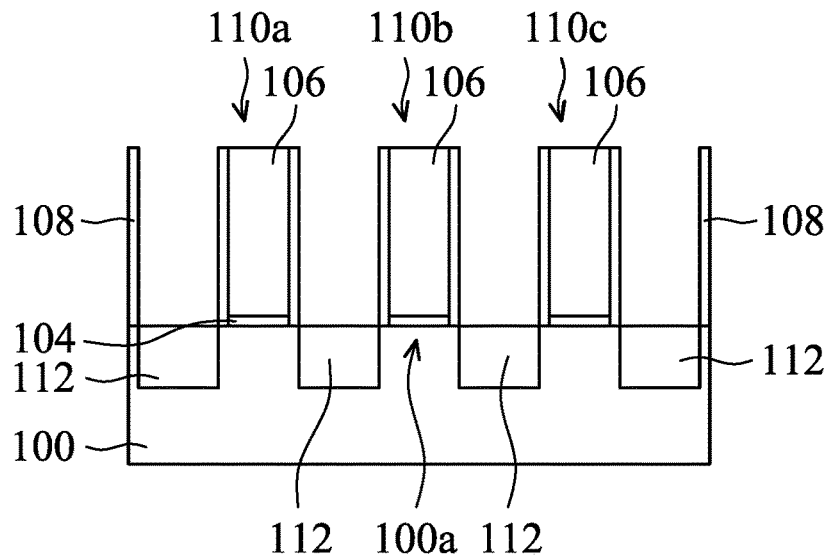
FIGS. 2A to 2P illustrate cross-sectional representations of various stages of manufacturing a semiconductor device structure in accordance with some embodiments.
Figure 2B:
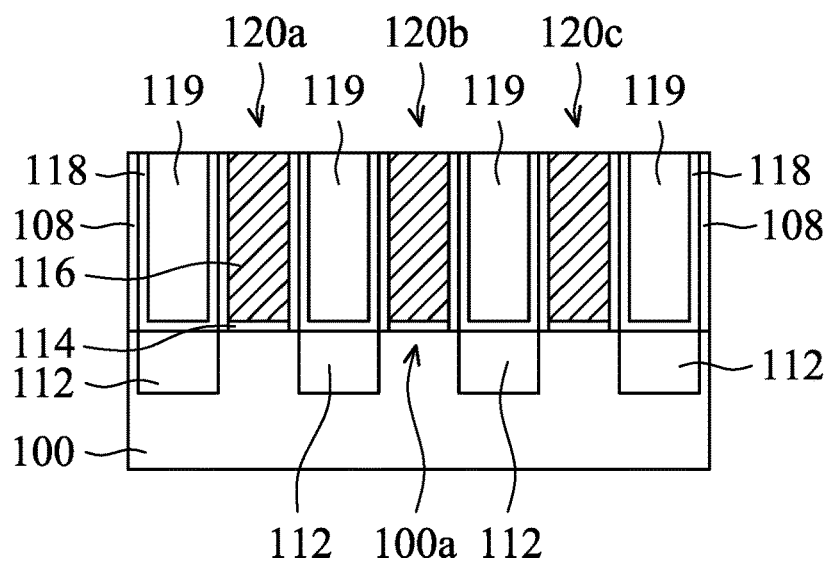
Figure 2C:
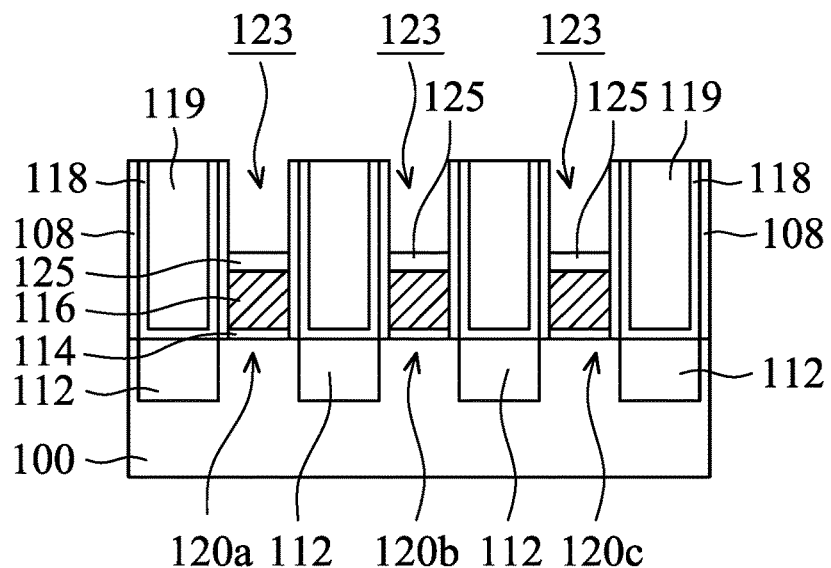
Figure 2D:
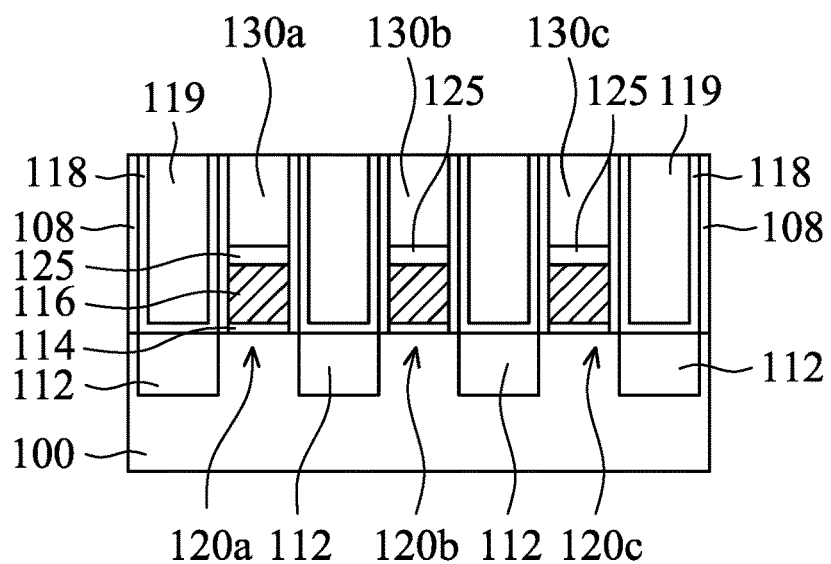
Figure 2E:
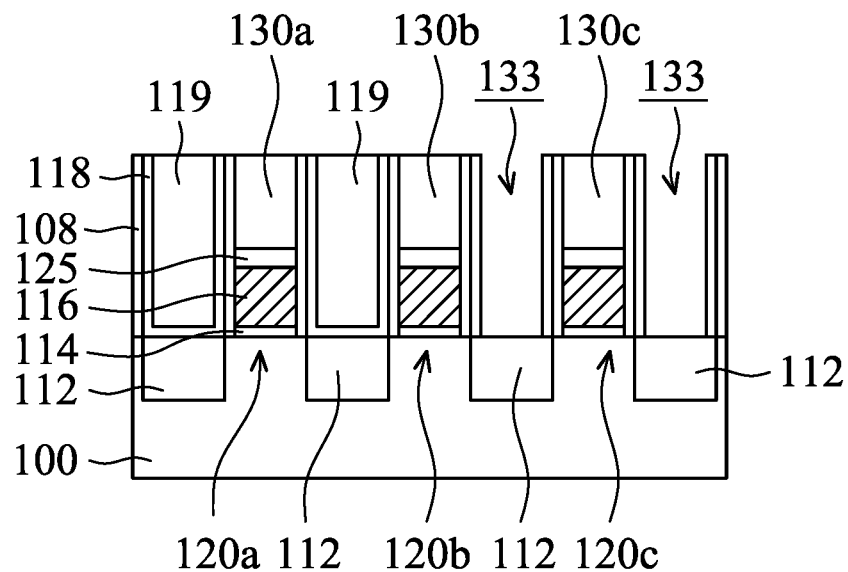
Figure 2F:
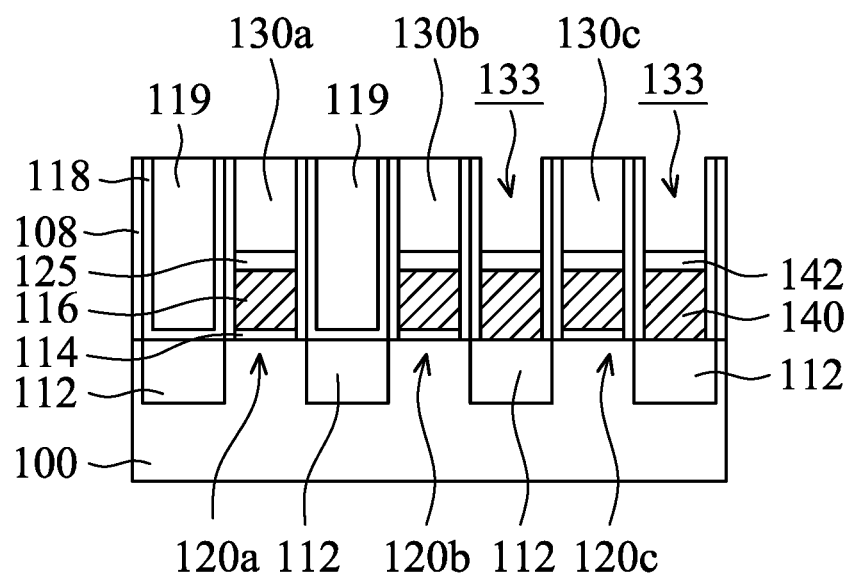
Figure 2G:
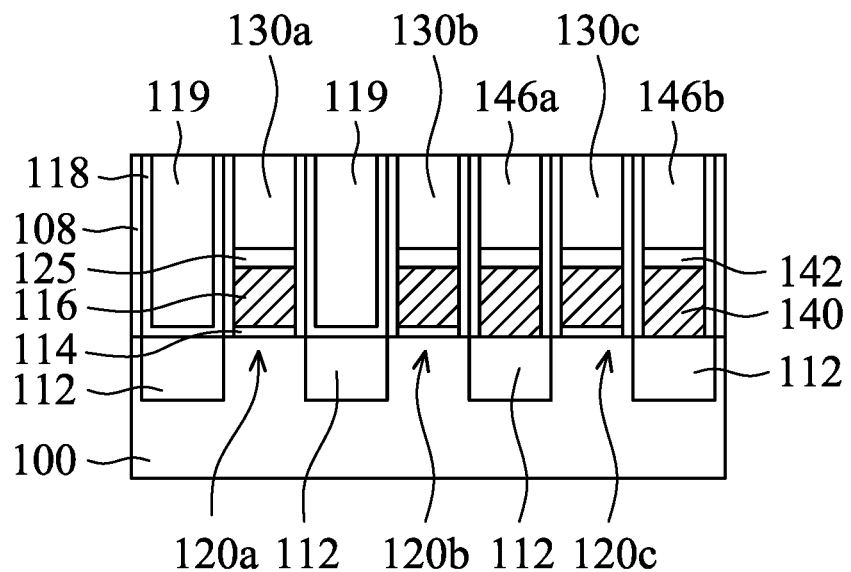
Figure 2H:
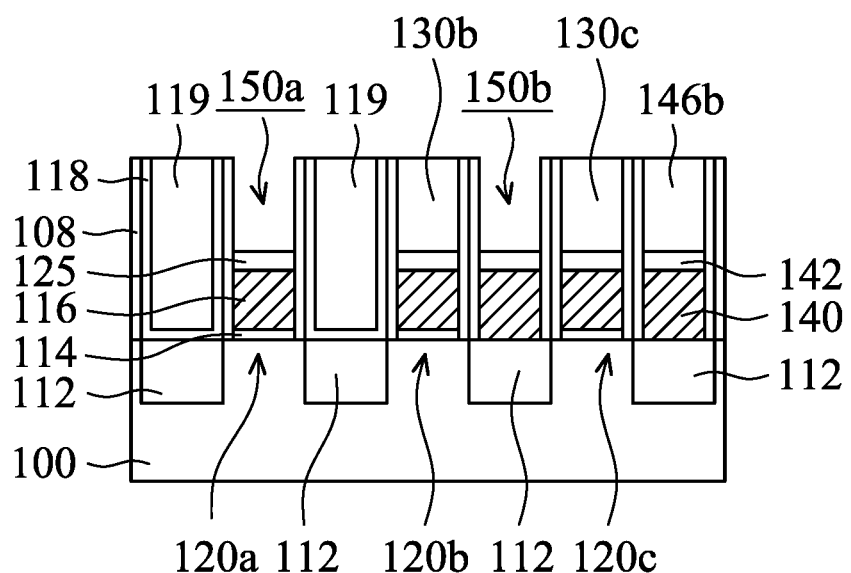
Figure 2I:
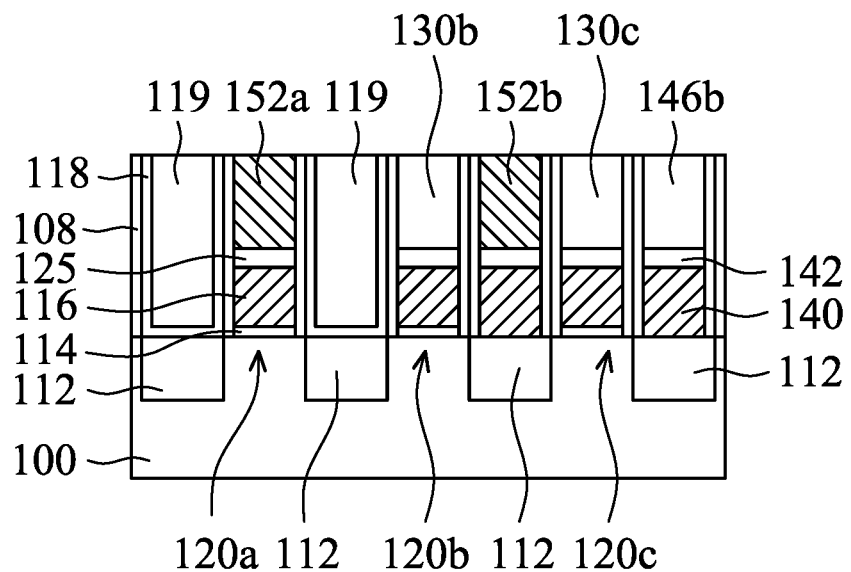
Figure 2J:
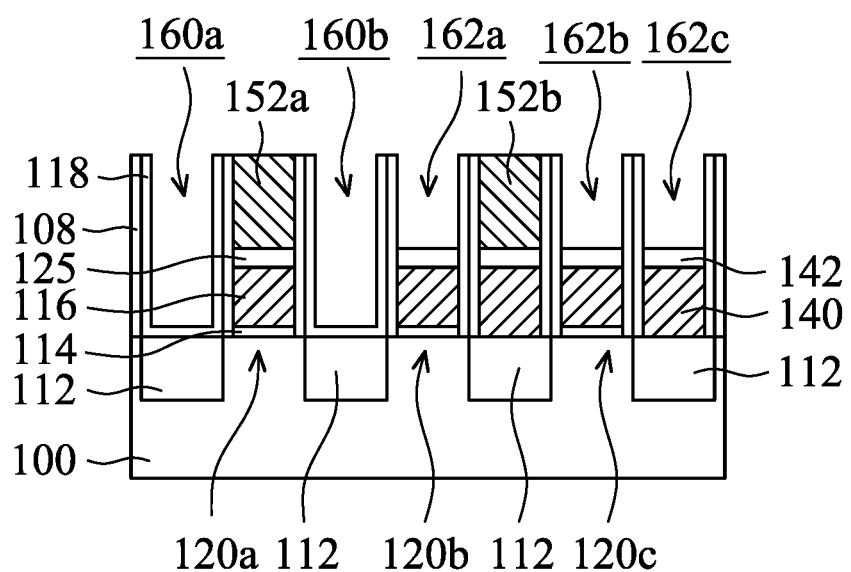
Figure 2K:
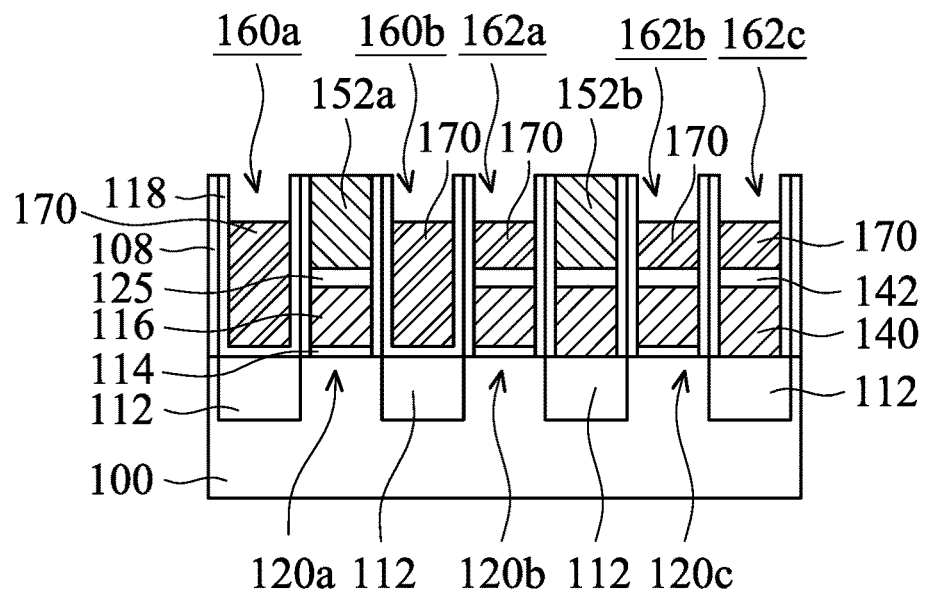
Figure 2L:
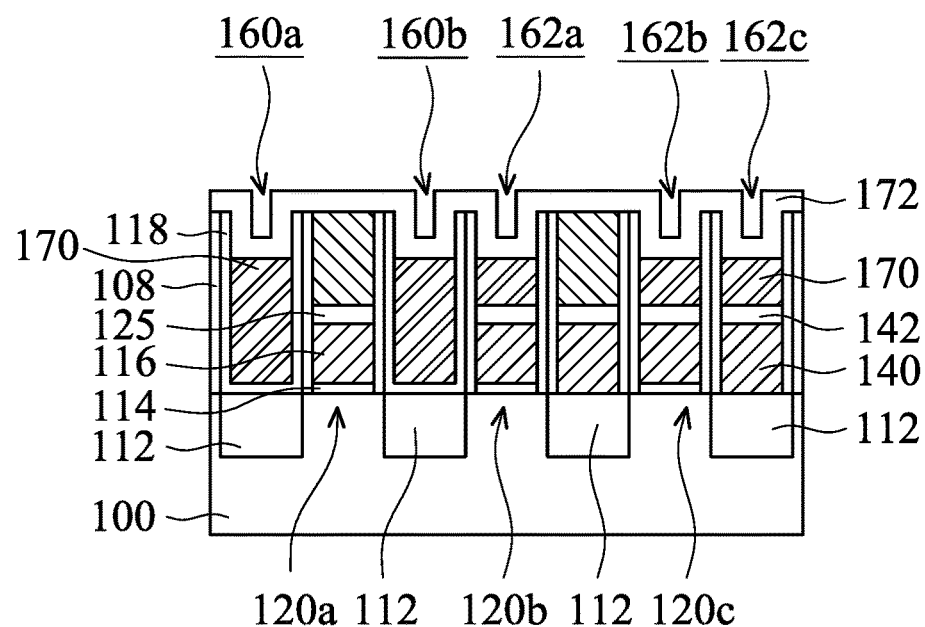
Figure 2M:
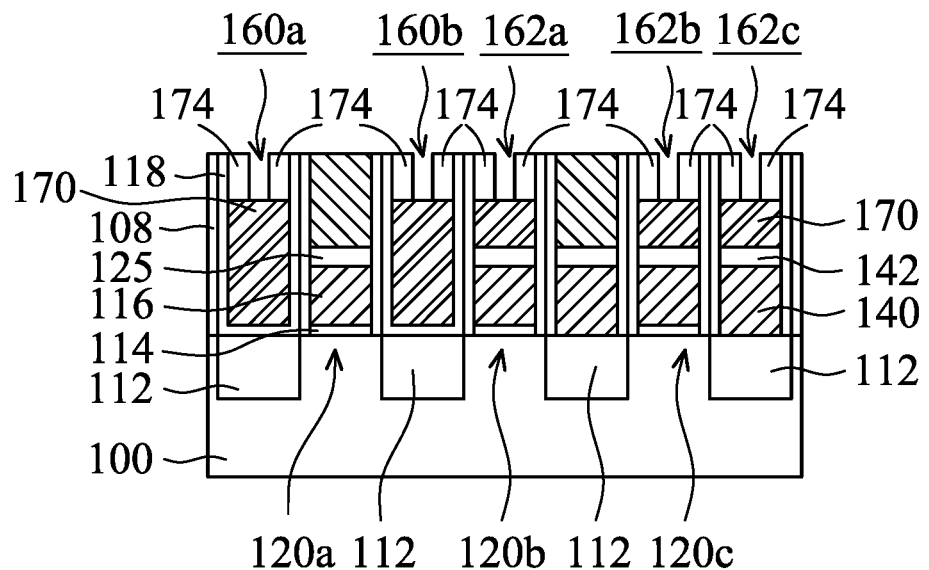
Figure 2N:
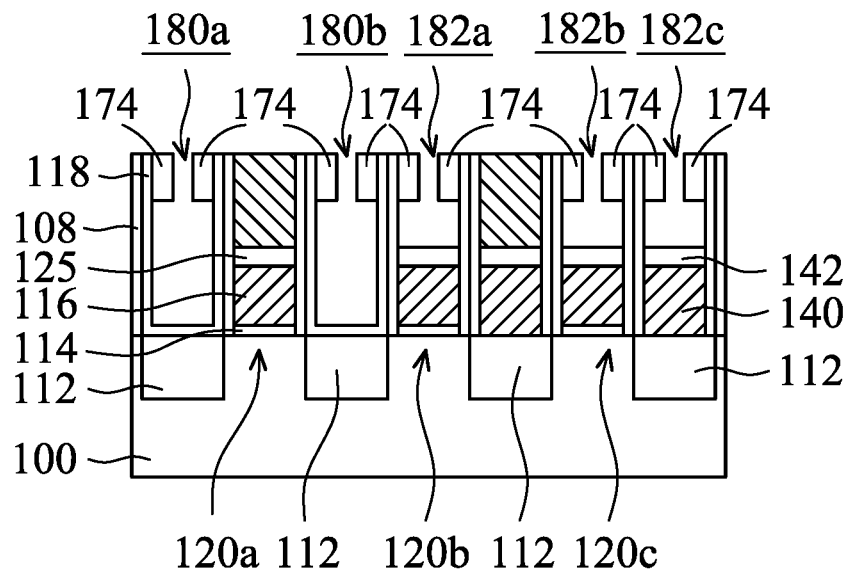
Figure 2O:
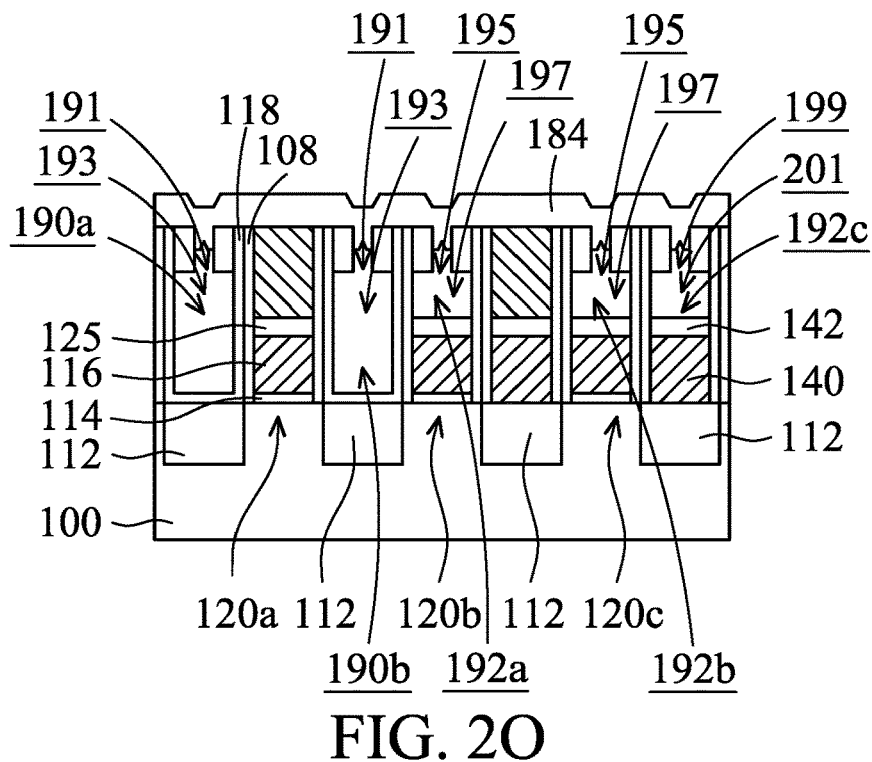
Figure 2P:
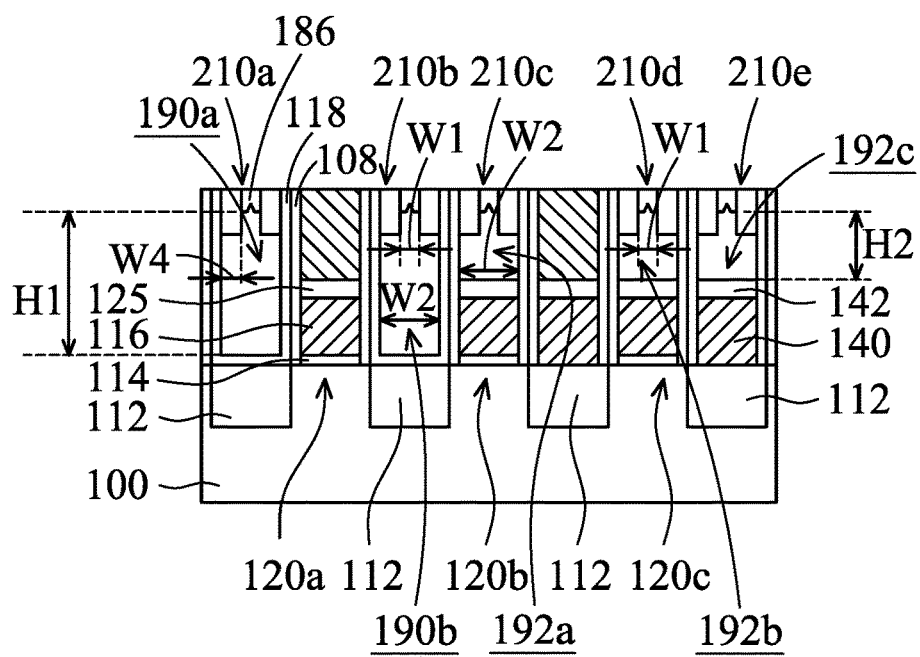

FIGS. 1A to 1D illustrate perspective views of various stages of manufacturing a semiconductor device structure and FIGS. 2A to 2P illustrate cross-sectional representations of various stages of manufacturing a semiconductor device structure in accordance with some embodiments. In addition, FIGS. 2A to 2D illustrate the cross-sectional representations of the semiconductor device structure shown along line 2-2' in FIGS. 1A to 1D in accordance with some embodiments. In some embodiments, the semiconductor device structure is implemented as a fin field effect transistor (FinFET) structure.

A fin structure 100a and an isolation structure 102 are formed over a substrate 100, as shown in FIGS. 1A and 2A in accordance with some embodiments. In some embodiments, the substrate 100 is a semiconductor substrate, such as a bulk semiconductor, a semiconductor-on-insulator (SOI) substrate, or the like, which may be doped (e.g. with a P-type or an N-type dopant) or undoped. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. In some embodiments, the substrate 100 is a wafer, such as a silicon wafer.

Other substrates, such as a multi-layered or gradient substrate may also be used. In some embodiments, the semiconductor material of the substrate 100 includes silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or a combination thereof.

In some embodiments, the substrate 100 includes silicon. In some embodiments, the substrate 100 includes an epitaxial layer. For example, the substrate 100 has an epitaxial layer overlying a bulk semiconductor.

In some embodiments, the substrate 100 has a PMOS region for P-type FinFETs formed thereon and/or an NMOS region for N-type FinFETs formed thereon. In some embodiments, the PMOS region of the substrate 100 includes Si, SiGe, SiGeB, or an III-V group semiconductor material (such as InSb, GaSb, or InGaSb). The NMOS region of the substrate 100 includes Si, SiP, SiC, SiPC, or an III-V group semiconductor material (such as InP, GaAs, AlAs, InAs, InAlAs, or InGaAs).

In some embodiments, the substrate 100 is patterned to form at least one fin structure 100a. The fin structure 100a may have slope sidewalls and extend from the patterned substrate 100. In some embodiments, the isolation structure 102 is a shallow trench isolation (STI) structure, and the fin structure 100a is surrounded by and protrude above the isolation structure 102.

The isolation structure 102 may be formed by depositing an insulating layer (not shown) over the substrate 100 and recessing the insulating layer. The recessed insulating layer for the formation of the isolation structure 102 may be made of silicon oxide, silicon nitride, silicon oxynitride, fluorosilicate glass (FSG), low-K dielectric materials, and/or another suitable dielectric material and may be deposited by a flowable CVD (FCVD) process, a chemical vapor deposition (CVD) process, an atomic layer deposition (ALD) process, or another applicable process.

Afterwards, dummy gate structures 110a, 110b, and 110c are formed across the fin structure 100a over the substrate 100 and cover the isolation structure 102, in accordance with some embodiments. Each of the dummy gate structures 110a, 110b, and 110c may include a dummy gate dielectric layer 104 and a dummy gate electrode layer 106 formed over the dummy gate dielectric layer 104. The dummy gate dielectric layer 104 may be made of silicon oxide and the dummy gate electrode layer 106 may be made of polysilicon.

After the formation of the dummy gate structures 110a, 110b, and 110c, gate spacers 108 are formed on the opposing sides (e.g., opposing sidewalls) of the dummy gate structures 110a, 110b, and 110c, in accordance with some embodiments. Each of the gate spacers 108 adjacent to the corresponding dummy gate structure, as shown in FIGS. 1A and 2A in accordance with some embodiments. The gate spacers 108 may be used for protecting dummy gate structures 110a, 110b, and 110c from damage or loss during subsequent processing. The gate spacers 108 are made of silicon nitride, silicon oxide, silicon oxynitride, silicon carbide, or another applicable dielectric material.

After formation of the gate spacers 108, source/drain features 112 are formed in the fin structure 100a adjacent to and exposed from the dummy gate structures 110a, 110b, and 110c, as shown in FIGS. 1A and 2A in accordance with some embodiments. In some embodiments, the source/drain features 112 is formed by recessing the fin structure 100a exposed from the dummy gate structures 110a, 110b, and 110c and growing semiconductor materials in the formed recesses in the fin structure 100a by performing epitaxial (epi) growth processes.

In some embodiments, the semiconductor device structure is an NMOS device, and the source/drain features 112 include Si, SiP, SiC, SiPC, or an III-V group semiconductor material (such as InP, GaAs, AlAs, InAs, InAlAs, or InGaAs), or the like. In some embodiments, the semiconductor device structure is a PMOS device, and the source/drain features 112 include Si, SiGe, SiGeB, or an III-V group semiconductor material (such as InSb, GaSb, or InGaSb), or the like. In some embodiments, the source/drain features 112 protrude above the isolation structure 102.

A contact etch stop layer 118 and an insulating layer 119 are successively formed over the isolation structure 102 after the source/drain features 112 are formed, as shown in FIGS. 1B and 2B in accordance with some embodiments. The contact stop layer 118 may be an insulating liner and conformally cover the sidewall of the gate spacers 108 (which are formed over the opposing sidewalls of the dummy gate structures 110a, 110b, and 110c), the source/drain features 112, and the isolation structure 102. The contact etch stop layer 118 may be used for forming contact holes (not shown) over the source/drain features 112 and for protecting subsequent active gate structures from damage or loss during subsequent processing.

In some embodiments, the contact etch stop layer 118 is made of a different material from the gate spacer 108, and it may include silicon nitride, silicon oxide, silicon carbide, silicon oxynitride, or another applicable material.

After the formation of the contact etch stop layer 118, the insulating layer 119 covers the contact etch stop layer 118 and the structure is shown in FIGS. 1A and 2A. Afterwards, a polishing process is performed to remove the excess insulating layer 119 and the contact etch stop layer 118 above the dummy gate structures 110a, 110b, and 110c, in accordance with some embodiments. Such a polishing process is performed until the insulating layer 119 is planarized and the dummy gate structures 110a, 110b, and 110c are exposed. In some embodiments, the polishing process includes a chemical mechanical polishing (CMP) process.

The remaining insulating layer 119 (which serves as an interlayer dielectric (ILD) layer) may be made of silicon oxide, tetraethyl orthosilicate (TEOS), phosphosilicate glass (PSG), borosilicate glass (BSG), boron-doped phosphosilicate Glass (BPSG), fluorosilicate glass (FSG), undoped silicate glass (USG), or the like. The insulating layer 119 may be deposited by any suitable method, such as a chemical vapor deposition (CVD) process, a plasma enhanced CVD (PECVD) process, flowable CVD (FCVD) process, the like, or a combination thereof. The insulating layer 119 may be a single layer or include multiple dielectric layers with the same or different dielectric materials.

Afterwards, the dummy gate structures 110a, 110b, and 110c are removed and replaced by gate structures 120a, 120b, and 120c, as shown in FIGS. 1B and 2B in accordance with some embodiments. In some embodiments, each of the gate structures 120a, 120b, and 120c at least includes a gate dielectric layer 114, a gate electrode layer 116, and the gate spacers 108. The gate dielectric layer 114 may be made of high-k materials, such as metal oxides, metal nitrides, or other applicable dielectric materials.

In some embodiments, the gate electrode layer 116 is made of a conductive material, such as aluminum, copper, tungsten, titanium, tantalum, or another applicable material.

Each of the gate structures 120a, 120b, and 120c may further include a work function metal layer (not shown) between the gate dielectric layer 114 and the gate electrode layer 116, so that the gate structures 120a, 120b, and 120c have the proper work function values. An exemplary p-type work function metal layer may be made of TiN, TaN, Ru, Mo, Al, WN, or a combination thereof. An exemplary n-type work function metal layer may be made of Ti, Ag, TaAl, TaAlC, TiAlN, TaC, TaCN, TaSiN, Mn, Zr, or a combination thereof.

Afterwards, the gate structures 120a, 120b, and 120c are recessed by etching, so as to form recesses 123 above the gate structures 120a, 120b, and 120c, as shown in FIGS. 1C and 2C in accordance with some embodiments. Therefore, the gate spacers 108 formed on opposing sidewalls of the gate electrode layer 116 extend above the gate electrode layer 108, so that the upper surface of the gate spacers 108 and the upper surface of the portions of the contact etch stop layer 118 adjacent to the gate spacers 108 are higher than the upper surface of the corresponding gate electrode layer 116, in accordance with some embodiments.

Afterwards, a conductive cap layer 125 is formed to cover each of the recessed gate electrode layers 116, as shown in FIGS. 1C and 2C in accordance with some embodiments. The conductive cap layers 125 and the underlying gate electrode layer 116 form gate stacks of the gate structures 120a, 120b, and 120c. In some embodiments, the upper surface of each gate spacer 108 is higher than the upper surface of each gate stack, as shown in FIGS. 1C and 2C. In some embodiments, the conductive cap layers 125 serve as etch stop layers or protective layers for protecting the gate electrode layers 116 from damage or loss during subsequent processing, and are made of a metal material, such as tungsten.

After the conductive cap layers 125 are formed, insulating cap layers 130a, 130b, and 130c are respectively formed in the recesses 123 (not shown and as indicated in FIGS. 1C and 2C) to cover each of the conductive cap layers 125, as shown in FIGS. 1D and 2D in accordance with some embodiments. The insulating cap layers 130a, 130b, and 130c are formed to cover the upper surfaces of gate stack in the gate structures 120a, 120b, and 120c. In some embodiments, an insulating layer (not shown) used for formation of the insulating cap layers 130a, 130b, and 130c is formed over the structure shown in FIGS. 1C and 2C and fills the recesses 123.

For example, the insulating layer is made of a different material than the material of the insulating layer 119 and includes high-k materials, such as metal oxides including $ZrO_2$, $HfO_2$, or SiN. The insulating layer may be formed by performing a chemical vapor deposition (CVD) process, a plasma enhanced CVD (PECVD) process, low-pressure CVD (LPCVD) process, an atomic layer deposition (ALD) process, or another applicable process.

Afterwards, a polishing process, such as a chemical mechanical polishing (CMP) process, is performed to remove the excess insulating layer above the insulating layer 119 in accordance with some embodiments. After the polishing process, the remaining insulating layer forms insulating cap layers 130a, 130b, and 130c, as shown in FIGS. 1D and 2D.

In some embodiments, the upper surfaces of the insulating cap layers 130a, 130b, and 130c are substantially level with the upper surface of the insulating layer 119. The insulating cap layers 130a, 130b, and 130c serve as etch stop layers and protect the gate structures 120a, 120b, and 120c in the subsequent manufacturing processes (e.g., etching processes).

After the insulating cap layers 130a, 130b, and 130c are formed, a patterned masking layer (not shown) is formed over the structure shown in FIGS. 1D and 2D, in accordance with some embodiments. The patterned masking layer may include a tri-layer resist structure including a bottom layer, a middle layer, and a top layer.

For example, the bottom layer is a first layer of the tri-layer resist structure. The bottom layer may contain a material that is patternable and/or have an anti-reflection property, such as a bottom anti-reflective coating (BARC) layer or a nitrogen-free anti-reflective coating (NFARC) layer. In some embodiments, the bottom layer is formed by a spin-on coating process, a chemical vapor deposition (CVD) process, a physical vapor deposition (PVD) process, or another suitable deposition process.

The middle layer is formed over the bottom layer and is a second layer of the tri-layer resist structure. The middle layer (which is also referred to as a hard mask layer) provides hard mask properties for the photolithography process. In addition, the middle layer is designed to provide etching selectivity from the bottom layer and the top layer. In some embodiments, the middle layer is made of silicon nitride, silicon oxynitride or silicon oxide and is formed by a spin-on coating process, a chemical vapor deposition (CVD) process, a physical vapor deposition (PVD) process, or another suitable deposition process.

The top layer is formed over the middle layer and is a third layer of the tri-layer resist structure. The top layer may be positive photoresist or negative photoresist. In some other embodiments, the tri-layer resist structure includes oxide-nitride-oxide (ONO) layers.

The patterned masking layer includes openings to expose the insulating layer 119 corresponding to some source/drain contact features 112, in accordance with some embodiments. Etching processes are performed on the exposed insulating layer 119, and the underlying portions of the contact etch stop layer 118 covering the source/drain features 112, so as to form two self-aligned openings 133, as shown in FIG. 2E in accordance with some embodiments.

During the self-aligned openings 133 are formed, the insulating cap layers 130a, 130b, and 130c are used as etch masks for protecting the gate structures 120a, 120b, and 120c. As a result, the self-aligned opening 133 is formed through the insulating layer 119 and the contact etch stop layer 118 to expose the upper surfaces of some source/drain features 112, as shown in FIG. 2E.

After the self-aligned openings 133 are formed, an ion implantation process may be performed to dope impurity (e.g., p-type impurities) into the exposed source/drain features 112. Afterwards, a salicide process may be performed to form salicide layers (not shown) over the exposed the upper surfaces of the source/drain features 112. The salicide layers may be formed by forming a metal layer over the upper surfaces of the source/drain features 112. Afterwards, an annealing process is performed on the metal layer so the metal layer reacts with the source/drain features 112. Afterwards, the unreacted metal layer is removed to form the salicide layers. Examples for forming the metal layer may include Ti, Co, Ni, NiCo, Pt, Ni(Pt), Ir, Pt(Ir), Er, Yb, Pd, Rh, Nb, TiSiN, and the like. Afterwards, the patterned masking layer is removed, as shown in FIG. 2E in accordance with some embodiments.

Source/drain contact structures 140 are respectively formed in the self-aligned openings 133, as shown in FIG. 2F in accordance with some embodiments. In some embodiments, the source/drain conductive structure 140 is made of Co, Ru, W, Cu, or the like. A conductive material (not shown) may be formed over the insulating layer 119 and the insulating cap layers 130a, 130b, and 130c, and fill the self-aligned opening 133 by a chemical vapor deposition (CVD) process, a physical vapor deposition, (PVD) process, an atomic layer deposition (ALD) process, an electroless deposition (ELD) process, an electrochemical plating (ECP) process, or another applicable process.

Afterwards, a polishing process is performed to remove the excess conductive material, in accordance with some embodiments. Such a polishing process is performed on the conductive material until the insulating cap layers 130a, 130b, and 130c are exposed and planarized. In some embodiments, the polishing process includes a chemical mechanical polishing (CMP) process.

After the polishing process, the remaining conductive material forms the source/drain contact structures 140 adjacent to and on opposing sides of the lower portion of the gate structure 120c. In some embodiments, one of source/drain contact structures 140 is between the gate structures 120b and 120c, and separated from the other one by the gate structure 120c, as shown in FIG. 2F. Those source/drain contact structures 140 are electrically connected to the corresponding source/drain features 112 in the fin structure 100a (not shown and indicated in FIGS. 2A and 2B), and separated from the gate stacks by the gate spacers 108 (which are formed on opposing sidewalls of the gate stacks).

Afterwards, each of the source/drain contact structures 140 is recessed, so that each of the recessed source/drain contact structures 140 has an upper surface that is lower than the bottom surface of the planarized insulating cap layers 130a, 130b, and 130c, as shown in FIG. 2F in accordance with some embodiments.

After the source/drain contact structures 140 are recessed, the conductive cap layers 125 have an upper surface that is higher than the upper surface of the source/drain contact structures 140. Afterwards, each of the source/drain contact structures 140 is covered by an optional conductive cap layer 142, as shown in FIG. 2F in accordance with some embodiments.

In some embodiments, the conductive cap layer 142 is in contact with the corresponding source/drain contact structure 140, and includes a material that is the same as or similar to that of the conductive cap layer 125. For example, the conductive cap layer 142 may be made of metal, such as tungsten, and formed by a selective deposition process. In some embodiments, the conductive cap layers 125 have an upper surface that is substantially level to the upper surface of the conductive cap layer 142.

After the conductive cap layers 142 are formed, the conductive cap layers 142 are respectively covered by insulating cap layers 146a and 146b, as shown in FIG. 2G in accordance with some embodiments.

In some embodiments, the insulating cap layers 146a and 146b are made of an insulating material that is the same as or different from the insulating layer 119. For example, the masking layer 148 may be made of silicon oxide or silicon nitride and formed by a method that is the same as or similar to the insulating layer 119. After the insulating cap layers 146a and 146b are formed, the upper surface of the insulating cap layers 146a and 146b are substantially level with the upper surface of the planarized insulating cap layers 130a, 130b, and 130c, as shown in FIG. 2G in accordance with some embodiments.

After the insulating cap layers 146a and 146b are formed, a patterned masking layer (not shown) is formed over the structure shown in FIG. 2G, in accordance with some embodiments. More specifically, the patterned masking layer is formed over the insulating layer 119. Moreover, the patterned masking layer has openings to expose the insulating cap 130a and the insulating cap layer 146a, in accordance with some embodiments.

Afterwards, in some embodiments, the exposed insulating cap 130a and the exposed insulating cap layer 146a are removed by an etching process (such as a dry etching process) or by respective etching processes using the patterned masking layer as an etch mask. As a result, the conductive cap layer 125 in the gate structure 120a and the conductive cap layer 142 between the gate structures 120b and 120c are exposed. Moreover, an opening 150a above the gate structure 120a and an opening 150b above the source/drain feature 112 and between the insulating cap layers 130b and 130c are formed. The opening 150a may be referred to as a self-aligned gate via opening, and the opening 150b may be referred to as a self-aligned source/drain via opening.

After the openings 150a and 150b are formed, the patterned masking layer is removed. Afterwards, a conductive material (not shown) is formed over the insulating layer 119, the insulating cap layers 130b and 130c and the insulating cap layer 146b, and fills the openings 150a and 150b, in accordance with some embodiments. The conductive material may be made of metal, such as W or Ru and formed by a chemical vapor deposition (CVD) process, a physical vapor deposition, (PVD) process, an atomic layer deposition (ALD) process, an electroless deposition (ELD) process, an electrochemical plating (ECP) process, or another applicable process.

Afterwards, a polishing process is performed to remove the excess conductive material until the insulating cap layers 130b and 130c, the gate spacers 108, the portions of the contact etch stop layer 118 adjacent to the gate spacers 108, the insulating cap layer 146b, and the insulating layer 119 are exposed and planarized, in accordance with some embodiments. In some embodiments, the polishing process includes a chemical mechanical polishing (CMP) process.

After the polishing process, the remaining conductive material forms conductive via structures 152a and 152b, as shown in FIG. 2I in accordance with some embodiments. In some embodiments, the conductive via structure 152a is in direct contact to the conductive cap layer 125 to electrically connect the gate electrode layer 116 of the gate structure 120a. Therefore, the conductive via structure 152a is referred to as a gate via structure. The conductive via structure 152b is in direct contact to the conductive cap layer 142 to electrically connect the source/drain contact structure 140 between the gate structures 120b and 120c. Therefore, the conductive via structure 152b is referred to as a source/drain via structure.

Afterwards, the insulating layer 119 on opposing sides of the gate structure 120a and the insulating cap layers 130b, 130c, and 146b are removed to form openings (which are sometimes referred to as spaces) 160a, 160b, 162a, 162b, and 162c, as shown in FIG. 2J in accordance with some embodiments. In some embodiments, those openings 160a, 160b, 162a, 162b, and 162c are formed by one or more dry or wet etching processes. Moreover, the openings 160a and 160b have substantially the same depth and the openings 162a, 162b, and 162c have substantially the same depth. In addition, the depth of the openings 160a and 160b is deeper than the depth of the openings 162a, 162b, and 162c.

After those openings 160a, 160b, 162a, 162b, and 162c are formed, a sacrificial material 170 is formed over the conductive via structures 152a and 152b and in the openings 160a, 160b, 162a, 162b, and 162c, in accordance with some embodiments. In some embodiments, the sacrificial material 170 is made of a spin-on organic polymer, such as a spin-on carbon. The spin-on carbon may include an organic polymer having a carbon content that is in a range from about 60% to about 90%. In addition, the organic polymer may also include hydrogen and/or oxygen.

In some other embodiments, the sacrificial material is made of a heat depolymerized material. The heat depolymerized material layer may include a polymer which is formed by polymerizing at least two different reactants (e.g., monomers). Such a polymer can be depolymerized by heat. Sometimes such a heat depolymerized material is also referred to as an ashless carbon (ALC) layer. The heat depolymerized material may be formed by a plasma deposition process, such as a chemical vapor deposition (CVD) process, a physical vapor deposition, (PVD) process, an atomic layer deposition (ALD) process, or another applicable process.

Afterwards, the sacrificial material 170 is etched back to remove the excess sacrificial material 170 above the conductive via structures 152a and 152b. Such an etch back is performed until the sacrificial material 170 in the openings 160a, 160b, 162a, 162b, and 162c is recessed below the top surface of the conductive via structures 152a and 152b and the top surface of the gate spacers 108, as shown in FIG. 2K in accordance with some embodiments.

In some embodiments, the sacrificial material 170 that is made of the spin-on organic polymer is recessed by a dry etching process.

In some other embodiments, the sacrificial material 170 that is made of the heat depolymerized material is recessed by an annealing process using $O_2$, $N_2$, NH, HF, $F_2$, or a combination thereof as a process gas. Alternatively, the heat depolymerized material is recessed by a dry etching process using $CF_4$, $CHF_3$, $O_2$, $O_3$, or a combination thereof as a process gas. Alternatively, the heat depolymerized material is recessed by an ashing process using $O_2$, $O_3$, or a combination thereof as a process gas.

After the openings 160a, 160b, 162a, 162b, and 162c and the sacrificial material 170 are formed, air gaps and insulating cap structures respectively covering the air gaps are formed, as shown in FIGS. 2L to 2P in accordance with some embodiments. More specifically, an insulating liner 172 is formed to conformally cover the structure shown in FIG. 2K, so that the spacers 108, the contact etch stop layer 118 adjacent to the gate spacers 108, the conductive via structures 152a and 152b, and the recessed sacrificial material 170 in the openings 160a, 160b, 162a, 162b, and 162c are conformally covered by the insulating liner 172, as shown in FIG. 2L in accordance with some embodiments.

The insulating liner 172 extends on and makes direct contact with the sidewalls and the bottom of the openings 160a, 160b, 162a, 162b, and 162c that have the recessed sacrificial material 170 therein. In some embodiments, the insulating liner 172 is used for formation of the insulating cap structures (as shown in FIG. 2P). In some embodiments, the insulating liner 172 has a thickness that is in a range from about 2 nm to about 10 nm. Moreover, the insulating liner 172 is made of a low-k material, such as $SiO_2$, SiOCN or another suitable low-k material. The insulating liner 172 may be formed by a deposition process, such as a chemical vapor deposition (CVD) process, or another applicable process.

After the formation of the insulating liner 172, insulating spacers 174 are formed over the recessed sacrificial material 170 in each of the openings 160a, 160b, 162a, 162b, and 162c, as shown in FIG. 2M in accordance with some embodiments. In some embodiments, portions of the insulating liner 172 are removed by an anisotropic etching process, to form two insulating spacers 174 over the recessed sacrificial material 170 in each of the openings 160a, 160b, 162a, 162b, and 162c. The two insulating spacers 174 are formed as spacer portions of the subsequently formed insulating cap structure.

Afterwards, the recessed sacrificial material 170 in each of the openings 160a, 160b, 162a, 162b, and 162c and below the corresponding insulating spacers 174 is removed to form inverted T-shaped openings 180a, 180b, 182a, 182b, and 182c respectively corresponding to the openings 160a, 160b, 162a, 162b, and 162c, as shown in FIG. 2N in accordance with some embodiments.

In some embodiments, the recessed sacrificial material 170 formed in each of the openings 160a, 160b, 162a, 162b, and 162c is removed by an ashing process when the recessed sacrificial material 170 is made of spin-on organic polymer. Alternatively, the recessed sacrificial material 170 formed in each of the openings 160a, 160b, 162a, 162b, and 162c is removed by an annealing process when the recessed sacrificial material 170 is made of the heat depolymerized material.

After the inverted T-shaped openings 180a, 180b, 182a, 182b, and 182c are formed, an insulating layer 184 is formed to cover the structure shown in FIG. 2N and partially fill the inverted T-shaped openings 180a, 180b, 182a, 182b, and 182c, as shown in FIG. 2O in accordance with some embodiments.

In some embodiments, the insulating layer 184 is also used for formation of the insulating cap structures. After the insulating layer 184 is formed, inverted T-shaped air gaps 190a, 190b, 192a, 192b, and 192c are formed and corresponded to the inverted T-shaped openings 180a, 180b, 182a, 182b, and 182c shown in FIG. 2N.

In some embodiments, each of the inverted T-shaped air gaps 190a and 190b includes a first portion 191 having a tip and formed between the two corresponding insulating spacers 174, so that the first portion 191 extends into the subsequently formed insulating cap structure. Each of the inverted T-shaped air gaps 190a and 190b also includes a second portion 193 extended from the bottom of the first portion 191 toward the fin structure 100a (not shown and indicated in FIGS. 2A and 2B) of the substrate 100.

Similarly, each of the inverted T-shaped air gaps 192a and 192b includes a first portion 195 having a tip and formed between the two corresponding insulating spacers 174, so that the first portion 195 extends into the subsequently formed insulating cap structure. Each of the inverted T-shaped air gaps 192a and 192b also includes a second portion 197 extended from the bottom of the first portion 195 toward the gate electrode 116 of the corresponding gate structure (e.g., the gate structure 120b or 120c).

Moreover, the inverted T-shaped air gap 192c includes a first portion 199 having a tip and formed between the two corresponding insulating spacers 174, so that the first portion 199 extends into the subsequently formed insulating cap structure. The inverted T-shaped air gaps 192c also includes a second portion 201 extended from the bottom of the first portion 199 toward the corresponding source/drain contact structure 140.

In some embodiments, the insulating layer 184 is made of a low-k material, such as $SiO_2$, SiOCN, or another suitable low-k material. The insulating layer 184 may be formed by a deposition process, such as a chemical vapor deposition (CVD) process, or another applicable process. The insulating layer 184 and the insulating spacers 174 may be made of the same material, such as $SiO_2$ or SiOCN or the like.

Alternatively, the insulating layer 184 and the insulating spacers 174 may be made of different materials. For example, the insulating layer 184 and the insulating spacers 174 may be made of SiO$_2$ and SiOCN, respectively, or the insulating layer 184 and the insulating spacers 174 may be made of SiOCN and SiO$_2$, respectively.

Afterwards, a polishing process is performed to remove the excess insulating layer 184 above the insulating spacers 174, as shown in FIG. 2P in accordance with some embodiments. In some embodiments, such a polishing process is performed on the insulating layer 184 until the upper surface of the conductive via structures 152*a* and 152*b* are exposed. In some embodiments, the polishing process includes a chemical mechanical polishing (CMP) process.

After the polishing process, the remaining insulating layer 184 filled in each of the inverted T-shaped openings 180*a*, 180*b*, 182*a*, 182*b*, and 182*c* forms an insulating bridge 186 between the two corresponding insulating spacers 174, so as to serve as a bridge portion of the subsequently formed insulating cap structure. As a result, insulating cap structures 201*a*, 201*b*, 201*c*, 201*d*, and 201*e* are respectively formed over the inverted T-shaped air gaps 190*a*, 190*b*, 192*a*, 192*b*, and 192*c*.

In some embodiments, each of the insulating cap structures 201*a* and 201*b* includes two spacer portions (e.g., the insulating spacers 174) on the top of the second portion 193 of the corresponding inverted T-shaped air gap (e.g., the inverted T-shaped air gap 190*a* or 190*b*).

Moreover, each of the insulating cap structures 201*a* and 201*b* also includes a bridged portion (e.g., the insulating bridge 186) between the two spacer portions and on the top of the first portion 191 of the corresponding inverted T-shaped air gap (e.g., the inverted T-shaped air gap 190*a* or 190*b*).

Similarly, each of the insulating cap structures 201*c* and 201*d* includes two spacer portions (e.g., the insulating spacers 174) on the top of the second portion 197 of the corresponding inverted T-shaped air gap (e.g., the inverted T-shaped air gap 192*a* or 192*b*).

Each of the insulating cap structures 201*c* and 201*d* also includes a bridged portion (e.g., the insulating bridge 186) between the two spacer portions and on the top of the first portion 195 of the corresponding inverted T-shaped air gap (e.g., the inverted T-shaped air gap 192*a* or 192*b*).

In addition, the insulating cap structure 201*e* includes two spacer portions (e.g., the insulating spacers 174) on the top of the second portion 201 of the corresponding inverted T-shaped air gap (e.g., the inverted T-shaped air gap 192*c*). Each of the insulating cap structure 201*e* also includes a bridged portion (e.g., the insulating bridge 186) between the two spacer portions and on the top of the first portion 199 of the corresponding inverted T-shaped air gap (e.g., the inverted T-shaped air gap 192*c*).

In some embodiments, each of the inverted T-shaped air gaps 190*a* and 190*b* has a height H1 and each of the inverted T-shaped air gaps 192*a*, 192*b*, and 192*c* has a height H2. Moreover, the height H1 is greater than the height H2. For example, the height H1 is in a range from about 11 nm to about 60 nm, and the height H2 is in a range from about 2 nm to about 25 nm.

In some embodiments, the first portion 191 of each of the inverted T-shaped air gaps 190*a* and 190*b*, the first portion 195 of each of the inverted T-shaped air gaps 192*a* and 190*b*, and the first portion 199 of the inverted T-shaped air gap 192*c* have a width W1. The second portion 193 of each of the inverted T-shaped air gaps 190*a* and 190*b*, the second portion 197 of each of the inverted T-shaped air gaps 192*a* and 192*b*, and the second portion 201 of the inverted T-shaped air gap 192*c* have a width W2. Moreover, the width W1 is less than the width W2. For example, the width W1 is in a range from about 1 nm to about 5 nm, and the width W2 is in a range from about 5 nm to about 25 nm.

In some embodiments, the first portion 195 of each of the inverted T-shaped air gaps 192*a* and 192*b* has a width W1. The second portion 197 of each of the inverted T-shaped air gaps 192*a*, 192*b*, and 192*c* has a width W2. Moreover, the width W1 is less than the width W2. For example, the width W1 is in a range from about 1 nm to about 5 nm, and the width W2 is in a range from about 5 nm to about 25 nm.

In some embodiments, the bridge portion (i.e., the insulating bridge 186) of each of the insulating cap structures 210*a*, 210*b*, 210*c*, 210*d*, and 210*e* have a width W3. The spacer portion (i.e., the insulating spacer 174) of each of the insulating cap structures 210*a*, 210*b*, 210*c*, 210*d*, and 210*e* have a width W4. Moreover, the width W3 is less than the width W4. For example, the width W3 is in a range from about 1 nm to about 5 nm, and the width W4 is in a range from about 2 nm to about 10 nm.

Figure 3:
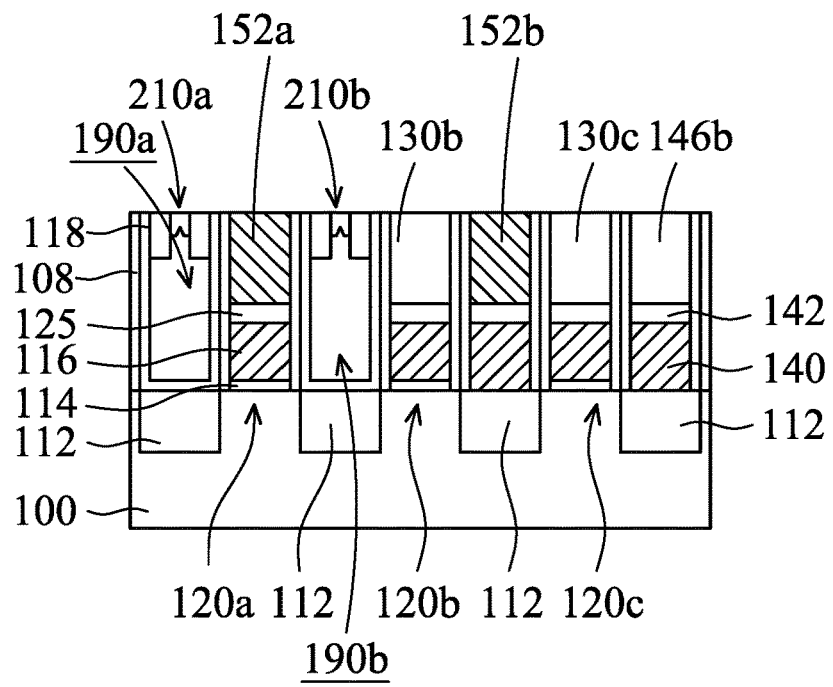
FIG. 3 illustrates a cross-sectional representation of a semiconductor device structure in accordance with some embodiments.
Figure 4:
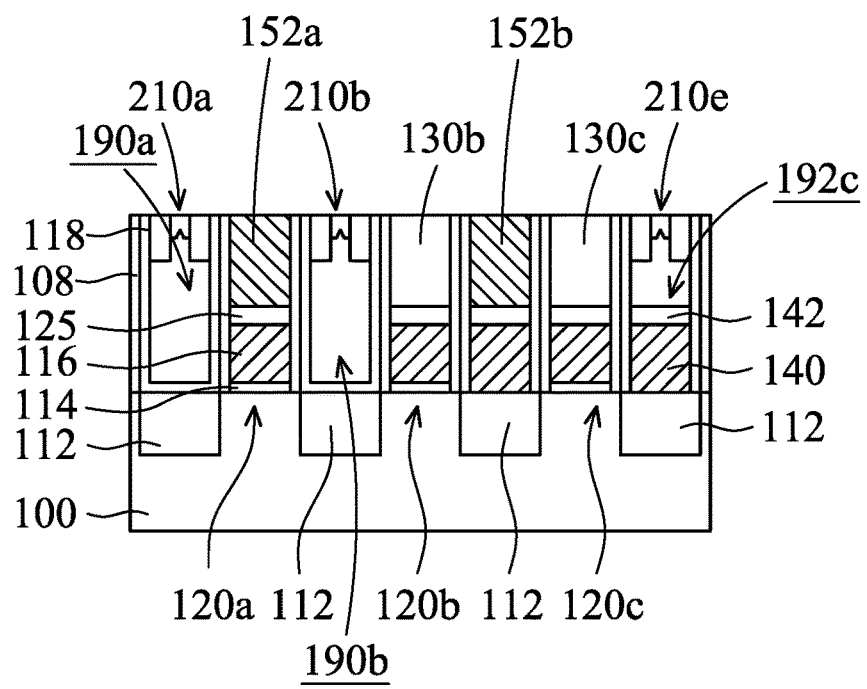
FIG. 4 illustrates a cross-sectional representation of a semiconductor device structure in accordance with some embodiments.
Figure 5:
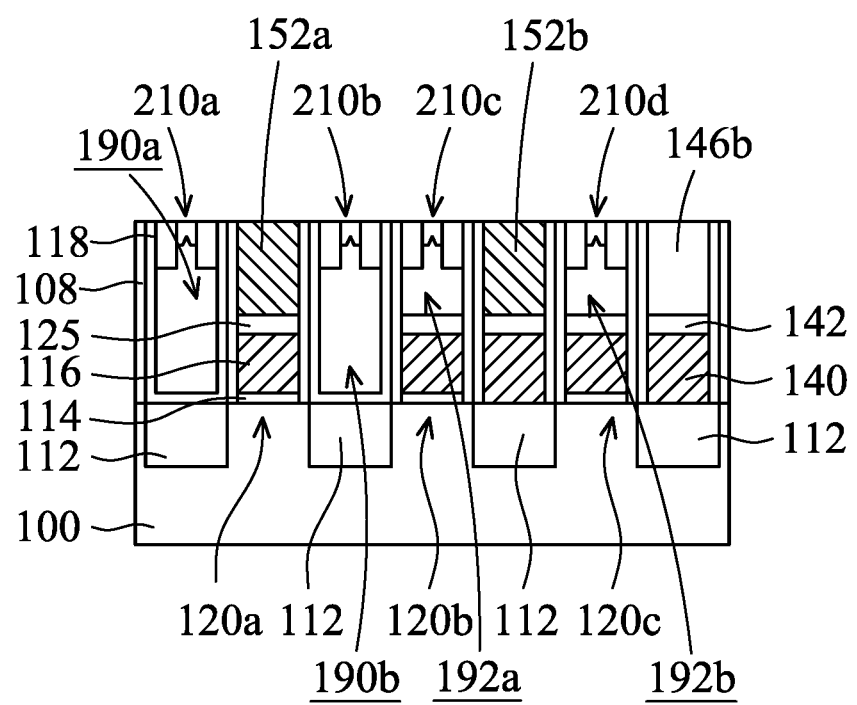
FIG. 5 illustrates a cross-sectional representation of a semiconductor device structure in accordance with some embodiments.

Although the semiconductor device structure shown in FIG. 2P includes the insulating cap structures 210*a*, 210*b*, 210*c*, 210*d*, and 210*e* and the inverted T-shaped air gaps 190*a*, 192*b*, 192*a*, 192*b*, and 192*c*, embodiments of the disclosure are not limited thereto. Many variations and/or modifications can be made to embodiments of the disclosure. FIGS. 3 to 5 illustrate cross-sectional representations of various semiconductor device structures in accordance with some embodiments. The processes and materials used for the semiconductor device structures shown in FIGS. 3 to 5 are similar to, or the same as those used for the semiconductor device structure shown in FIG. 2P and are not repeated herein.

In some embodiments, the semiconductor device structure shown in FIG. 3 is similar to the semiconductor device structure shown in FIG. 2P. Unlike the semiconductor device structure shown in FIG. 2P, the semiconductor device structure shown in FIG. 3 does not include the insulating cap structures 210*c*, 210*d*, and 210*e* and the inverted T-shaped air gaps 192*a*, 192*b*, and 192*c* respectively formed below the insulating cap structures 210*c*, 210*d*, and 210*e*. In those cases, the spaces for those insulating cap structures 210*c*, 210*d*, and 210*e* and the inverted T-shaped air gaps 192*a*, 192*b*, and 192*c* are replaced by the insulating cap layers 130*b*, 130*c* and 146*b*.

Alternatively, such spaces are respectively replaced by the gate electrode 116 of the gate structure 120*b*, the gate electrode 116 of the gate structure 120*c*, and the source/drain conductive structure 140.

In some embodiments, the semiconductor device structure shown in FIG. 4 is similar to the semiconductor device structure shown in FIG. 2P. Unlike the semiconductor device structure shown in FIG. 2P, the semiconductor device structure shown in FIG. 4 does not include the insulating cap structures 210*c* and 210*d* and the inverted T-shaped air gaps 192*a* and 192*b* respectively formed below the insulating cap structures 210*c* and 210*d*. In those cases, the spaces for those insulating cap structures 210*c* and 210*d* and the inverted T-shaped air gaps 192*a* and 192*b* are replaced by the insulating cap layers 130*b* and 130*c*.

Alternatively, such spaces are respectively replaced by the gate electrode 116 of the gate structure 120*b* and the gate electrode 116 of the gate structure 120*c*.

In some embodiments, the semiconductor device structure shown in FIG. 5 is similar to the semiconductor device structure shown in FIG. 2P. Unlike the semiconductor device structure shown in FIG. 2P, the semiconductor device structure shown in FIG. 5 does not include the insulating cap structure 210e and the inverted T-shaped air gap 192c formed below the insulating cap structure 210e. In those cases, the space for the insulating cap structure 210e and the inverted T-shaped air gap 192c are replaced by the insulating cap layer 146b.

Embodiments of semiconductor device structures and methods for forming the same are provided. The semiconductor device structure includes two adjacent gate structures formed over a semiconductor substrate and an insulating cap structure formed between the two adjacent gate structures. The insulating cap structure and the semiconductor substrate are separated by an air gap having two different widths. The formation of the insulating cap structure and the air gap includes forming a recessed sacrificial material in a space between the two adjacent gate structures and forming two insulating spacers over the recessed sacrificial material. Afterwards, the recessed sacrificial material is removed and an insulating bridge is then formed between the insulating spacers to form the insulating cap structure and the air gap covered by the insulating cap structure. Since the air gap has a lower dielectric constant (k) than that of the dielectric materials, the parasitic capacitance between the two adjacent gate structures and between the conductive via structure and the adjacent gate stack in the gate structure can be reduced. In addition, since the insulating cap structure can be made of a low-k material, the parasitic capacitance can be lowered further. As a result, the device performance can be effectively increased.

In some embodiments, a semiconductor device structure is provided. The semiconductor device structure a first gate structure and a second gate structure formed over a semiconductor substrate. The semiconductor device structure also includes a first insulating cap structure formed between and adjacent to the first gate structure and the second gate structure. The first insulating cap structure is separated from the semiconductor substrate by a first air gap. The first air gap includes a first portion extending into the first insulating cap structure and a second portion extended from a bottom of the first portion toward the semiconductor substrate. The first portion has a width that is less than a width of the second portion.

In some embodiments, a semiconductor device structure is provided. The semiconductor device structure includes a fin structure extending from a semiconductor substrate. The semiconductor device structure also includes a first gate structure, a second gate structure, and a third gate structure across the fin structure. The semiconductor device structure further includes a first source/drain contact structure formed between and adjacent to the second gate structure and the third gate structure and a second source/drain contact structure separated from the first source/drain contact structure by the third gate structure. In addition, the semiconductor device structure includes a first insulating cap structure formed between the first gate structure and the second gate structure. The first insulating cap structure is separated from the fin structure by a first inverted T-shaped air gap, and a portion of the first inverted T-shaped air gap is extended into the first insulating cap structure.

In some embodiments, a method for forming a semiconductor device structure is provided. The method includes forming a first gate structure and a second gate structure over a semiconductor substrate and across a fin structure of the semiconductor substrate. Each of the first gate structure and the second gate structure includes a gate electrode layer and two gate spacers formed on opposing sidewalls of the gate electrode layer. The method also includes forming a sacrificial material in a space between the first gate structure and the second gate structure and recessing the sacrificial material, so that a top surface of the sacrificial material is below a top surface of each of the gate spacers. The method further includes forming two first insulating spacers over the recessed sacrificial material in the space between the first gate structure and the second gate structure and removing the recessed sacrificial material below the first insulating spacers. In addition, the method includes forming a first insulating bridge between the first insulating spacers to form a first insulating cap structure and a first air gap between the first insulating cap structure and the fin structure.

The fins described above may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
   a first gate structure and a second gate structure formed over a semiconductor substrate; and
   a first insulating cap structure formed between and adjacent to the first gate structure and the second gate structure, wherein the first insulating cap structure is separated from the semiconductor substrate by a first air gap, and wherein the first air gap comprises:
   a first portion extending into the first insulating cap structure; and
   a second portion extended from a bottom of the first portion toward the semiconductor substrate, wherein the first portion has a width that is less than a width of the second portion.

2. The semiconductor device structure as claimed in claim 1, wherein the first insulating cap structure comprises:
   two spacer portions on a top of the second portion of the first air gap; and
   a bridged portion between the two spacer portions and on a top of the first portion of the first air gap.

3. The semiconductor device structure as claimed in claim 1, further comprising an insulating liner extending along a sidewall of the first gate structure, a sidewall of the second gate structure and a bottom of the second portion of the first air gap.

4. The semiconductor device structure as claimed in claim 1, wherein each of the first gate structure and the second gate structure comprises:
  a gate electrode layer; and
  two gate spacers formed on opposing sidewalls of the gate electrode layer and extending above the gate electrode layer.

5. The semiconductor device structure as claimed in claim 4, further comprising:
  a via structure formed over and electrically connected to the gate electrode layer of the first gate structure; and
  a second insulating cap structure formed between and adjacent to the gate spacers of the second gate structure, and separated from the gate electrode layer of the second gate structure by a second air gap, wherein the second air gap comprises:
    a third portion extending into the second insulating cap structure; and
    a fourth portion extended from a bottom of the third portion toward the gate electrode layer of the second gate structure, wherein the third portion has a width that is less than a width of the fourth portion.

6. The semiconductor device structure as claimed in claim 1, further comprising:
  a third gate structure formed over the semiconductor substrate, comprising:
    a gate electrode layer; and
    two gate spacers formed on opposing sidewalls of the gate electrode layer and extending above the gate electrode layer.

7. The semiconductor device structure as claimed in claim 6, further comprising:
  a source/drain contact structure formed between and adjacent to the second gate structure and the third gate structure;
  a via structure formed over and electrically connected to the source/drain contact structure; and
  a second insulating cap structure formed between and adjacent to the gate spacers, and separated from the gate electrode layer by a second air gap, wherein the second air gap comprises:
    a third portion extending into the second insulating cap structure; and
    a fourth portion extended from a bottom of the third portion toward the gate electrode layer of the second gate structure, wherein the third portion has a width that is less than a width of the fourth portion.

8. The semiconductor device structure as claimed in claim 6, further comprising:
  a source/drain contact structure formed adjacent to a lower portion of the third gate structure;
  a second insulating cap structure formed adjacent to an upper portion of the third gate structure and separated from the source/drain contact structure by a second air gap, wherein the second air gap comprises:
    a third portion extending into the second insulating cap structure; and
    a fourth portion extended from a bottom of the third portion toward the source/drain contact structure, wherein the third portion has a width that is less than a width of the fourth portion.

9. A semiconductor device structure, comprising:
  a fin structure extending from a semiconductor substrate;
  a first gate structure, a second gate structure, and a third gate structure across the fin structure;
  a first source/drain contact structure formed between and adjacent to the second gate structure and the third gate structure;
  a second source/drain contact structure separated from the first source/drain contact structure by the third gate structure; and
  a first insulating cap structure formed between the first gate structure and the second gate structure, wherein the first insulating cap structure is separated from the fin structure by a first inverted T-shaped air gap, and wherein a portion of the first inverted T-shaped air gap is extended into the first insulating cap structure.

10. The semiconductor device structure as claimed in claim 9, further comprising:
  a first via structure formed over and electrically connected to a gate electrode layer of the first gate structure; and
  a second via structure formed over and electrically connected to the first source/drain contact structure.

11. The semiconductor device structure as claimed in claim 10, further comprising:
  a second insulating cap structure formed between the first insulating cap structure and the second via structure, wherein the second insulating cap structure is separated from a gate electrode layer of the second gate structure by a second inverted T-shaped air gap, and wherein a portion of the second inverted T-shaped air gap is extended into the second insulating cap structure;
  a third insulating cap structure separated from the second insulating cap structure by the second via structure and separated from a gate electrode layer of the third gate structure by a third inverted T-shaped air gap, and wherein a portion of the third inverted T-shaped air gap is extended into the third insulating cap structure; and
  a fourth insulating cap structure separated from the second via structure by the third insulating cap structure and separated from the second source/drain contact structure by a fourth inverted T-shaped air gap, and wherein a portion of the fourth inverted T-shaped air gap is extended into the fourth insulating cap structure.

12. The semiconductor device structure as claimed in claim 11, wherein each of the first insulating cap structure, the second insulating cap structure, the third insulating cap structure, and the fourth insulating cap structure comprises:
  two spacer portions separated by a bridged portion, wherein the spacer portions extend below a bottom of the bridged portion.

13. The semiconductor device structure as claimed in claim 12, wherein the spacer portions are made of a material that is different from a material of the bridged portion.

14. The semiconductor device structure as claimed in claim 11, wherein the first inverted T-shaped air gap has a greater height than a height of the second inverted T-shaped air gap, the third inverted T-shaped air gap, or the fourth inverted T-shaped air gap.

15. The semiconductor device structure as claimed in claim 9, further comprising an insulating liner extending along a sidewall of the first gate structure, a sidewall of the second gate structure and a bottom of the first inverted T-shaped air gap.

16. A semiconductor device structure, comprising:
  a first gate electrode formed over a semiconductor substrate and having a first sidewall and a second sidewall opposite to the first sidewall;
  a first insulating cap structure formed adjacent to the first sidewall of the first gate electrode and separated from the semiconductor substrate by a first inverted T-shaped air gap; and a second insulating cap structure formed adjacent to the second sidewall of the first gate electrode and separated from the semiconductor substrate by a second inverted T-shaped air gap, wherein a height of the second inverted T-shaped air gap is substantially equal to a height of the first inverted T-shaped air gap and greater than a height of the first gate electrode.

17. The semiconductor device structure as claimed in claim 16, further comprising:
a second gate electrode formed over the semiconductor substrate and separated from the first gate electrode by the first inverted T-shaped air gap; and
a third insulating cap structure formed over and separated from the second gate electrode by a third inverted T-shaped air gap, wherein a height of the third inverted T-shaped air gap is less than the height of the first inverted T-shaped air gap.

18. The semiconductor device structure as claimed in claim 16, further comprising:
a second gate electrode formed over the semiconductor substrate and separated from the first gate electrode by the first inverted T-shaped air gap; and
a first insulating cap layer formed over the second gate electrode; and
a first conductive cap layer formed between and in direct contact with the second gate electrode and the first insulating cap layer.

19. The semiconductor device structure as claimed in claim 18, further comprising:
a first source/drain conductive structure formed over the semiconductor substrate and separated from the first inverted T-shaped air gap by the second gate electrode;
a third gate electrode formed over the semiconductor substrate and separated from the second gate electrode by the first source/drain conductive structure;
a second source/drain conductive structure formed over the semiconductor substrate and separated from the first source/drain conductive structure by the third gate electrode;
a second insulating cap layer formed over the second source/drain conductive structure; and
a second conductive cap layer formed between and in direct contact with the second source/drain conductive structure and the second insulating cap layer.

20. The semiconductor device structure as claimed in claim 18, further comprising:
a first source/drain conductive structure formed over the semiconductor substrate and separated from the first inverted T-shaped air gap by the second gate electrode;
a third gate electrode formed over the semiconductor substrate and separated from the second gate electrode by the first source/drain conductive structure;
a second source/drain conductive structure formed over the semiconductor substrate and separated from the first source/drain conductive structure by the third gate electrode; and
a third insulating cap structure formed over and separated from the second source/drain conductive structure by a third inverted T-shaped air gap, wherein a height of the third inverted T-shaped air gap is less than the height of the first inverted T-shaped air gap.

* * * * *